US011740386B2

(12) United States Patent
Laugier et al.

(10) Patent No.: US 11,740,386 B2
(45) Date of Patent: Aug. 29, 2023

(54) DETERMINATION OF REPRESENTATIVE WELLS TO CHARACTERIZE SUBSURFACE REGIONS

(71) Applicant: Chevron U.S.A. Inc., San Ramon, CA (US)

(72) Inventors: Fabien J. Laugier, Houston, TX (US); Alicia Downard, Golden, CO (US); Robert Chadwick Holmes, Houston, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 513 days.

(21) Appl. No.: 16/947,401

(22) Filed: Jul. 30, 2020

(65) Prior Publication Data

US 2022/0035070 A1    Feb. 3, 2022

(51) Int. Cl.
| | |
|---|---|
| *G01V 99/00* | (2009.01) |
| *G06F 30/20* | (2020.01) |
| *G06V 10/75* | (2022.01) |
| *G06F 18/22* | (2023.01) |
| *G06F 18/211* | (2023.01) |
| *E21B 41/00* | (2006.01) |
| *E21B 49/00* | (2006.01) |
| *G01V 1/30* | (2006.01) |
| *G01V 1/28* | (2006.01) |

(52) U.S. Cl.
CPC ............ *G01V 99/005* (2013.01); *E21B 41/00* (2013.01); *E21B 49/00* (2013.01); *G01V 1/282* (2013.01); *G01V 1/301* (2013.01); *G06F 18/211* (2023.01); *G06F 18/22* (2023.01); *G06F 30/20* (2020.01); *G06V 10/751* (2022.01); *E21B 2200/20* (2020.05); *G01V 2210/64* (2013.01); *G01V 2210/66* (2013.01)

(58) Field of Classification Search
CPC ...... G01V 99/005; G01V 1/282; G01V 1/301; G01V 2210/64; G01V 2210/66; G06F 30/20; G06F 18/22; G06F 18/211; G06V 10/751; E21B 41/00; E21B 49/00; E21B 2200/20
USPC ...................................................... 703/6, 10
See application file for complete search history.

(56) References Cited

U.S. PATENT DOCUMENTS

| | | | | |
|---|---|---|---|---|
| 7,630,517 | B2* | 12/2009 | Mirowski | G01V 11/00 702/179 |
| 2016/0326845 | A1* | 11/2016 | Djikpesse | E21B 49/00 |
| 2021/0222523 | A1* | 7/2021 | Sun | G06F 30/13 |

FOREIGN PATENT DOCUMENTS

WO    WO-2018208634 A1 *  11/2018  ............. G01V 1/306

* cited by examiner

*Primary Examiner* — John E Johansen
(74) *Attorney, Agent, or Firm* — ESPLIN & ASSOCIATES, PC

(57) ABSTRACT

Simulated wells may be selected from a subsurface representation to serve as representation of the corresponding simulated subsurface region. Spatial coverage of a simulated well for the simulated subsurface region may be determined based on extent of similarity between the simulated well and other simulated wells in the subsurface representation. The simulated wells may be selected to achieve desired spatial coverage for the simulated subsurface region and to achieve desired representation of properties of interest for the simulated subsurface region.

20 Claims, 10 Drawing Sheets

DETERMINATION OF REPRESENTATIVE WELLS TO CHARACTERIZE SUBSURFACE REGIONS

FIELD

The present disclosure relates generally to the field of determining wells to represent a subsurface region using spatial representative coverage of the wells and representation of properties of interest for the subsurface region.

BACKGROUND

Subsurface representations may provide information on simulated subsurface configuration of simulated subsurface regions. Amount of data provided by subsurface representations may make it challenging to utilize these subsurface representations to understand environments of deposition simulated by the subsurface representations.

SUMMARY

This disclosure relates to determining wells to represent a subsurface region. Subsurface representation information and/or other information may be obtained. The subsurface representation information may define a subsurface representation. The subsurface representation may define simulated subsurface configuration of a simulated subsurface region. The simulated subsurface region may include simulated wells. Properties of interest for the simulated subsurface region may be determined based on the simulated subsurface configuration of the simulated subsurface region and/or other information. Extent of similarity between individual ones of the simulated wells and other ones of the simulated wells may be determined based on comparison of the simulated subsurface configuration of the simulated wells and/or other information. Spatial representative coverage of an individual simulated well for the simulated subsurface region may be determined based on thresholding the extent of similarity between the individual simulated well and other simulated wells and/or other information. Representative wells may be selected from the simulated wells. The representative wells may be selected based on the properties of interest for the simulated subsurface region, the spatial representative coverage of the simulated wells, and/or other information. The representative wells may be selected to achieve desired spatial representative coverage for the simulated subsurface region and to achieve desired representation of the properties of interest for the simulated subsurface region.

A system that determines wells to represent a subsurface region may include one or more electronic storage, one or more processors and/or other components. The electronic storage may store subsurface representation information, information relating to subsurface representation, information relating to simulated subsurface configuration, information relating to simulated subsurface region, information relating to properties of interest for simulated subsurface region, information relating to simulated wells, information relating to extent of similarity between simulated wells, information relating to spatial representative coverage of simulated wells, information relating to representative wells, information relating to desired spatial representative coverage, information relating to desired representation of properties of interest for simulated subsurface region, and/or other information.

The processor(s) may be configured by machine-readable instructions. Executing the machine-readable instructions may cause the processor(s) to facilitate determining wells to represent a subsurface region. The machine-readable instructions may include one or more computer program components. The computer program components may include one or more of a subsurface representation component, a properties component, a similarity component, a representative well component, and/or other computer program components.

The subsurface representation component may be configured to obtain subsurface representation information and/or other information. The subsurface representation information may define a subsurface representation. The subsurface representation may define simulated subsurface configuration of a simulated subsurface region. The simulated subsurface region may include simulated wells. In some implementations, the simulated subsurface region may be a temporal zone or a spatial zone of a larger simulated subsurface region.

The properties component may be configured to determine properties of interest for the simulated subsurface region. The properties of interest for the simulated subsurface region may be determined based on the simulated subsurface configuration of the simulated subsurface region and/or other information. In some implementations, the properties of interest for the simulated subsurface region may include net-to-gross ratio and thickness and/or other properties of interest.

The similarity component may be configured to determine extent of similarity between individual ones of the simulated wells and other ones of the simulated wells. The extent of similarity between the simulated wells may be determined based on comparison of the simulated subsurface configuration of the simulated wells and/or other information. Spatial representative coverage of an individual simulated well for the simulated subsurface region may be determined based on thresholding the extent of similarity between the individual simulated well and other simulated wells.

In some implementations, the extent of similarity between the individual ones of the simulated wells and the other ones of the simulated wells may be determined as values of similarity metric. Thresholding the extent of similarity between the individual simulated well and the other simulated wells may be performed based on a similarity metric threshold, and/or other information.

The representative well component may be configured to select representative wells from the simulated wells. The representative wells may be selected based on the properties of interest for the simulated subsurface region, the spatial representative coverage of the simulated wells, and/or other information. The representative wells may be selected to achieve desired spatial representative coverage for the simulated subsurface region and to achieve desired representation of the properties of interest for the simulated subsurface region.

In some implementations, selecting the representative wells from the simulated wells may include determining a number of the representative wells and spatial arrangement of the representative wells. In some implementations, the number of the representative wells may be fixed, and the spatial arrangement of the representative wells may be determined to maximize spatial representative coverage of the representative wells. In some implementations, determining the number of the representative wells may include determining a minimum number of wells needed to achieve the desired spatial representative coverage for the simulated subsurface region.

In some implementations, the representative wells may be selected simultaneously to achieve the desired representation of the properties of interest for the simulated subsurface region. In some implementations, the representative wells may be selected sequentially to achieve the desired representation of the properties of interest for the simulated subsurface region. The sequential selection of the representative wells may be performed based on an ordering of the properties of interest for the simulated subsurface region and/or other information.

In some implementations, multiple sets of the representative wells may be selected. A common pattern of spatial arrangement of the representative wells within the multiple sets may be identified. The common pattern of the spatial arrangement of the representative wells may provide a pattern of wells for a subsurface region.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a," "an," and "the" include plural referents unless the context clearly dictates otherwise.

DETAILED DESCRIPTION

The present disclosure relates to determining wells to represent a subsurface region. Simulated wells may be selected from a subsurface representation to serve as representation of the corresponding simulated subsurface region. Spatial coverage of a simulated well for the simulated subsurface region may be determined based on extent of similarity between the simulated well and other simulated wells in the subsurface representation. The simulated wells may be selected to achieve desired spatial coverage for the simulated subsurface region and to achieve desired representation of properties of interest for the simulated subsurface region. The present disclosure may be utilized as a mechanism to select representative wells (e.g., the most representative wells) for a subsurface region. For example, the present disclosure may be utilized to determine the optimal number and optimal spatial arrangement of wells to represent the subsurface configuration of a subsurface region. For instance, the present disclosure may be used to determine the optimal number and optimal spatial arrangement of wells needed to provide stratigraphic characterization of environments of deposition. For example, this information may be used to drill wells for optimized reservoir appraisal and/or optimized reservoir performance.

Figure 1:
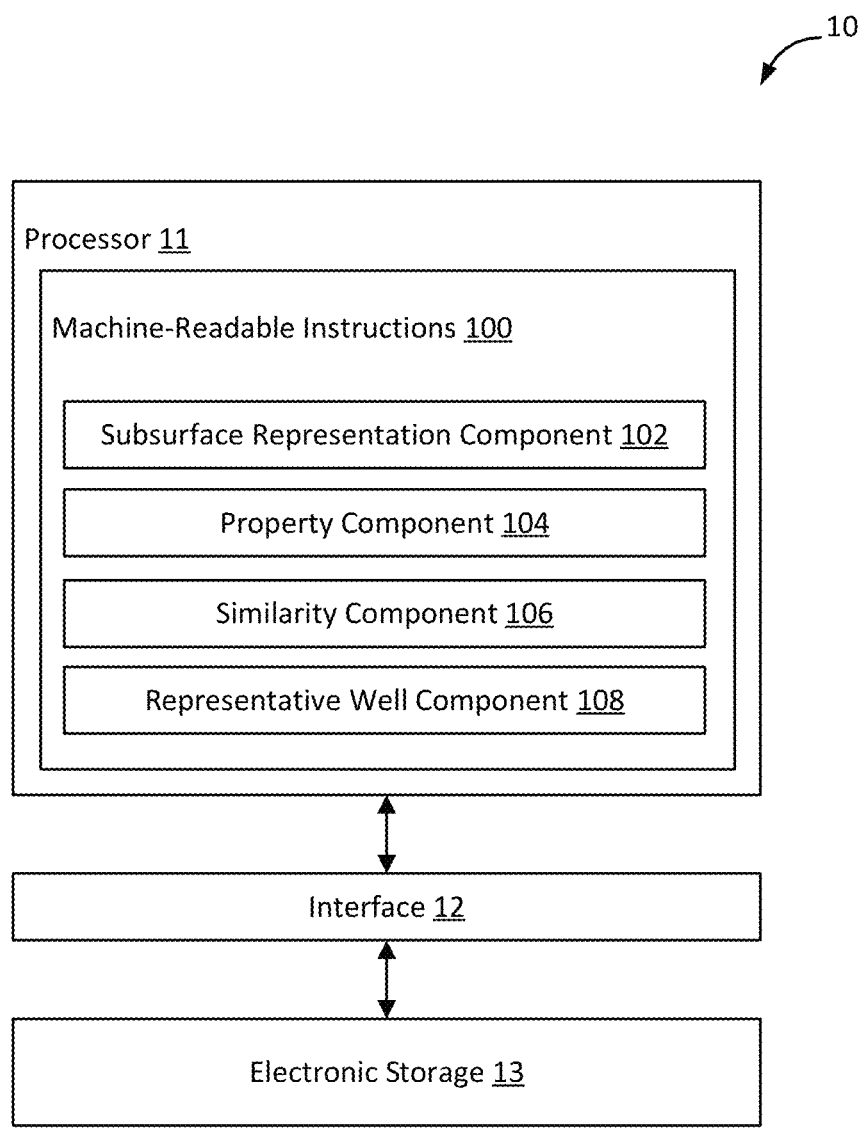
FIG. 1 illustrates an example system that determines wells to represent a subsurface region.

The methods and systems of the present disclosure may be implemented by and/or in a computing system, such as a system 10 shown in FIG. 1. The system 10 may include one or more of a processor 11, an interface 12 (e.g., bus, wireless interface), an electronic storage 13, and/or other components. Subsurface representation information and/or other information may be obtained by the processor 11. The subsurface representation information may define a subsurface representation. The subsurface representation may define simulated subsurface configuration of a simulated subsurface region. The simulated subsurface region may include simulated wells. Properties of interest for the simulated subsurface region may be determined by the processor 11 based on the simulated subsurface configuration of the simulated subsurface region and/or other information. Extent of similarity between individual ones of the simulated wells and other ones of the simulated wells may be determined by the processor 11 based on comparison of the simulated subsurface configuration of the simulated wells and/or other information. Spatial representative coverage of an individual simulated well for the simulated subsurface region may be determined by the processor 11 based on thresholding the extent of similarity between the individual simulated well and other simulated wells and/or other information. Representative wells may be selected by the processor 11 from the simulated wells. The representative wells may be selected based on the properties of interest for the simulated subsurface region, the spatial representative coverage of the simulated wells, and/or other information. The representative wells may be selected to achieve desired spatial representative coverage for the simulated subsurface region and to achieve desired representation of the properties of interest for the simulated subsurface region.

Characterization and interpretation of reservoir type or environment of deposition (EOD) may be critical for addressing the key subsurface challenges of predicting reservoir volumes, heterogeneity, and connectivity, which may impact Estimated Ultimate Recovery (EUR). Reservoir appraisal may be a fundamental step in assessing reservoir volumes, heterogeneity, and connectivity and may be focused on appropriately sampling the reservoir. Asset development strategies may heavily rely on the understanding of reservoir heterogeneity based on appraisal phase constraints.

For example, EOD may directly impact the spatial extent, quality, heterogeneity, and connectivity of subsurface reservoirs. In order to make more informed decisions on developing reservoirs, appraisal strategies may seek to drill minimum number of wells necessary to characterize a reservoir's key properties, such as the amount and character of heterogeneity. The results from such wells may drive investment decisions and development strategies, and may ultimately impact the volume of hydrocarbons recoverable from the reservoir. Decisions on where to place appraisal and development wells, how to build a reservoir model, and how to estimate performance are thus directly tied to the interpretation of EOD and the knowledge of the spatial lengthsscales of heterogeneities associated with different depositional environments.

Interpretation of EODs commonly relies on an integration of high-resolution well-log/core data and lower-resolution seismic reflection data. Due to high well costs and low resolution seismic, the amount of information achieved in the appraisal phase may be usually limited and insufficient for optimizing development strategies on the heterogeneity of the reservoir, resulting in uncertain EUR estimates and non-optimal reservoir performance. Sparse well data and low resolution seismic may be insufficient to appropriately characterize the reservoir heterogeneity of EODs.

In response to this lack of high-resolution data from actual assets, subsurface representations (e.g., numerical models/ analogs, 3D models) of reservoirs, such as computational stratigraphy models and/or Dionisos models, may be leveraged. Subsurface representations may provide a source of digital analogs which may be evaluated to understand the internal complexity and heterogeneity of EOD. Based on the understanding gained from the subsurface representations, more informed predications of these parameters may be made for physical assets. However, subsurface representations may represent enormous volumes of data, and processing the amount of data may be costly. Mechanisms are required to effectively process the data provided by the subsurface representations and synthesize the information in a way that can drive a better understanding of reservoir heterogeneity so that appraisal and development strategies can be optimized.

A key to understanding the subsurface representations is determining which data points and/or combinations of data points within the subsurface representations are most/more informative of the subsurface regions being represented by the subsurface representations. Additionally, for applying the concept of appraisals to the subsurface representations, it is important to determine the location and spatial arrangement (pattern) of the minimum number of data points needed to explain as much of the subsurface representations' properties as possible. The present disclosure provides a workflow that enables such analysis. For example, the workflow allows for "synthetic" appraisals of every possible well within the subsurface representations that are analogous to a reservoir's EOD, and enables identification of the minimal number of wells necessary to capture desired spatial coverage and combination of properties. The approaches disclosed herein may be utilized to determine the optimal number and spatial arrangement of simulated wells (e.g., 1D pseudo-wells, extractions of a subsurface representation) necessary for adequate representation/characterization of the subsurface representation's environment of deposition.

The approaches disclosed herein may be applied to multiple instances of different EODs to determine the number (e.g., minimum number) and spatial arrangement of wells needed to appropriately characterize a specific environment of deposition. The number and spatial arrangement of wells may be used to facilitate selection of appraisal/development wells for appropriate analyses of reservoir properties and selection of optimal scenarios for asset development. For example, when performed on multiple realizations of the same type of EOD and compared to similar analyses on other EODs, the result may enable a quantitative understanding of the number and pattern of wells that are necessary to explain/characterize a reservoir. Results from this workflow may help constrain appraisal and development strategies by providing an effective value of information on well locations for estimating the specific target EOD's bulk properties and heterogeneity characteristics. The approaches disclosed herein may reduce costs and increase effectiveness of appraisal and development strategies by providing recommendations on the required number of wells and their associated spatial arrangements.

Referring back to FIG. 1, the electronic storage 13 may be configured to include electronic storage medium that electronically stores information. The electronic storage 13 may store software algorithms, information determined by the processor 11, information received remotely, and/or other information that enables the system 10 to function properly. For example, the electronic storage 13 may store subsurface representation information, information relating to subsurface representation, information relating to simulated subsurface configuration, information relating to simulated subsurface region, information relating to properties of interest for simulated subsurface region, information relating to simulated wells, information relating to extent of similarity between simulated wells, information relating to spatial representative coverage of simulated wells, information relating to representative wells, information relating to desired spatial representative coverage, information relating to desired representation of properties of interest for simulated subsurface region, and/or other information.

The processor 11 may be configured to provide information processing capabilities in the system 10. As such, the processor 11 may comprise one or more of a digital processor, an analog processor, a digital circuit designed to process information, a central processing unit, a graphics processing unit, a microcontroller, an analog circuit designed to process information, a state machine, and/or other mechanisms for electronically processing information. The processor 11 may be configured to execute one or more machine-readable instructions 100 to facilitate determining wells to represent a subsurface region. The machine-readable instructions 100 may include one or more computer program components. The machine-readable instructions 100 may include one or more of a subsurface representation component 102, a property component 104, a similarity component 106, a representative well component 108, and/or other computer program components.

The subsurface representation component 102 may be configured to obtain subsurface representation information and/or other information. Obtaining subsurface representation information may include one or more of accessing, acquiring, analyzing, creating, determining, examining, generating, identifying, loading, locating, opening, receiving, retrieving, reviewing, selecting, storing, utilizing, and/or otherwise obtaining the subsurface representation information. The subsurface representation component 102 may obtain subsurface representation information from one or more locations. For example, the subsurface representation component 102 may obtain subsurface representation information from a storage location, such as the electronic storage 13, electronic storage of a device accessible via a network, and/or other locations. The subsurface representation component 102 may obtain subsurface representation information from one or more hardware components (e.g., a computing device, a component of a computing device) and/or one or more software components (e.g., software running on a computing device). Subsurface representation information may be stored within a single file or multiple files.

The subsurface representation information may define a subsurface representation. The subsurface representation information may define a subsurface representation by including information that describes, delineates, identifies, is associated with, quantifies, reflects, sets forth, and/or otherwise defines one or more of content, quality, attribute, feature, and/or other aspects of the subsurface representation. For example, the subsurface representation information may define a subsurface representation by including information that makes up the content of the subsurface representation and/or information that is used to identify/determine the content of the subsurface representation. Other types of subsurface representation information are contemplated.

A subsurface representation may refer to a computer-generated representation of a subsurface region, such as a three-dimensional model of the subsurface region. A subsurface representation may be representative of a subsurface volume sampled by one or more wells. A subsurface representation may be representative of the depositional environment of wells. A subsurface representation may include geologically plausible arrangement of rock obtained from a modeling process (e.g., stratigraphic forward modeling process). A subsurface representation may include/be a seismic volume. A subsurface representation may provide simulated subsurface configuration at different locations within a three-dimensional subsurface region (e.g., provide simulated well log values at locations in a three-dimensional (x-y-z) coordinate system).

A subsurface region may refer to a part of earth located beneath the surface/located underground. A subsurface region may refer to a part of earth that is not exposed at the surface of the ground. A subsurface region may be defined in a single dimension or in multiple dimensions. For example, a three-dimensional subsurface region may be defined in three-dimensions, and may define a volume of earth.

A subsurface representation may define simulated subsurface configuration of a simulated subsurface region. Simulated subsurface configuration may refer to subsurface configuration simulated within a subsurface representation. Subsurface configuration may refer to attribute, quality, and/or characteristics of a subsurface region. Subsurface configuration may refer to physical arrangement of materials (e.g., subsurface elements) within a subsurface region. Examples of subsurface configuration may include types of subsurface materials, characteristics of subsurface materials, compositions of subsurface materials, arrangements/configurations of subsurface materials, physics of subsurface materials, and/or other subsurface configuration. For instance, subsurface configuration may include and/or define types, shapes, and/or properties of materials and/or layers that form subsurface (e.g., geological, petrophysical, geophysical, stratigraphic) structures. A simulated subsurface region may refer to a subsurface region simulated within a subsurface representation. That is, a subsurface representation may define subsurface configuration of a subsurface region simulated by and/or through one or more subsurface models. A subsurface model may refer to a computer model (e.g., program, tool, script, function, process, algorithm) that generates subsurface representations. A subsurface model may simulate subsurface configuration within a region underneath the surface (subsurface region).

An example of a subsurface model is a computational stratigraphy model. A computational stratigraphy model may refer to a computer model that simulates depositional and/or stratigraphic processes on a grain size scale while honoring physics-based flow dynamics. A computational stratigraphy model may simulate rock properties, such as velocity and density, based on rock-physics equations and assumptions. Input to a computational stratigraphy model may include information relating to a subsurface region to be simulated. For example, input to a computational stratigraphy model may include paleo basin floor topography, paleo flow and sediment inputs to the basin, and/or other information relating to the basin. In some implementations, input to a computational stratigraphy model may include one or more paleo geologic controls, such as climate changes, sea level changes, tectonics and other allocyclic controls. Output of a computational stratigraphy model may include one or more subsurface representations. A subsurface representation generated by a computational stratigraphy model may be referred to as a computational stratigraphy model representation.

A subsurface model may include a forward stratigraphic model. A forward stratigraphic model may be an event-based model, a process mimicking model, a reduced physics-based model, and/or a fully physics-based model (e.g., fully based on physics of flow and sediment transport). A forward stratigraphic model may simulate one or more sedimentary processes that recreate the way stratigraphic successions develop and/or are preserved. The forward stratigraphic model may be used to numerically reproduce the physical processes that eroded, transported, deposited, and/or modified the sediments over variable time periods. In a forward modelling approach, data may not be used as the anchor points for facies interpolation or extrapolation. Rather, data may be used to test and validate the results of the simulation. Stratigraphic forward modelling may be an iterative approach, where input parameters have to be modified until the results are validated by actual data. Usage of other subsurface models and other subsurface representations are contemplated.

In some implementations, the subsurface configuration may be defined by values of one or more subsurface properties as a function of position within the subsurface region/subsurface representation. A subsurface property may refer to a particular attribute, quality, and/or characteristics of a subsurface region. For instance, the subsurface configuration of a subsurface region may be defined by values of multiple subsurface properties at different spatial positions within the subsurface region/subsurface representation. For example, the subsurface configuration of a subsurface region may be defined by values of sand thickness, sand quality, sand volume, and/or other sand characteristics at different spatial positions within the subsurface region/subsurface representation. Other subsurface properties are contemplated.

In some implementations, a subsurface representation may be representative of a subsurface region of interest. For example, the simulated subsurface configuration defined by a subsurface representation may be representative of the subsurface configuration of a reservoir of interest and/or representative of an environment of deposition of interest. Other subsurface regions of interest are contemplated. In some implementations, a subsurface representation may be scaled in area size and thickness to match a subsurface region of interest. For example, lateral size and/or vertical depth of a subsurface representation may be changed to be comparable to the size and thickness of a subsurface region of interest.

Figure 3:
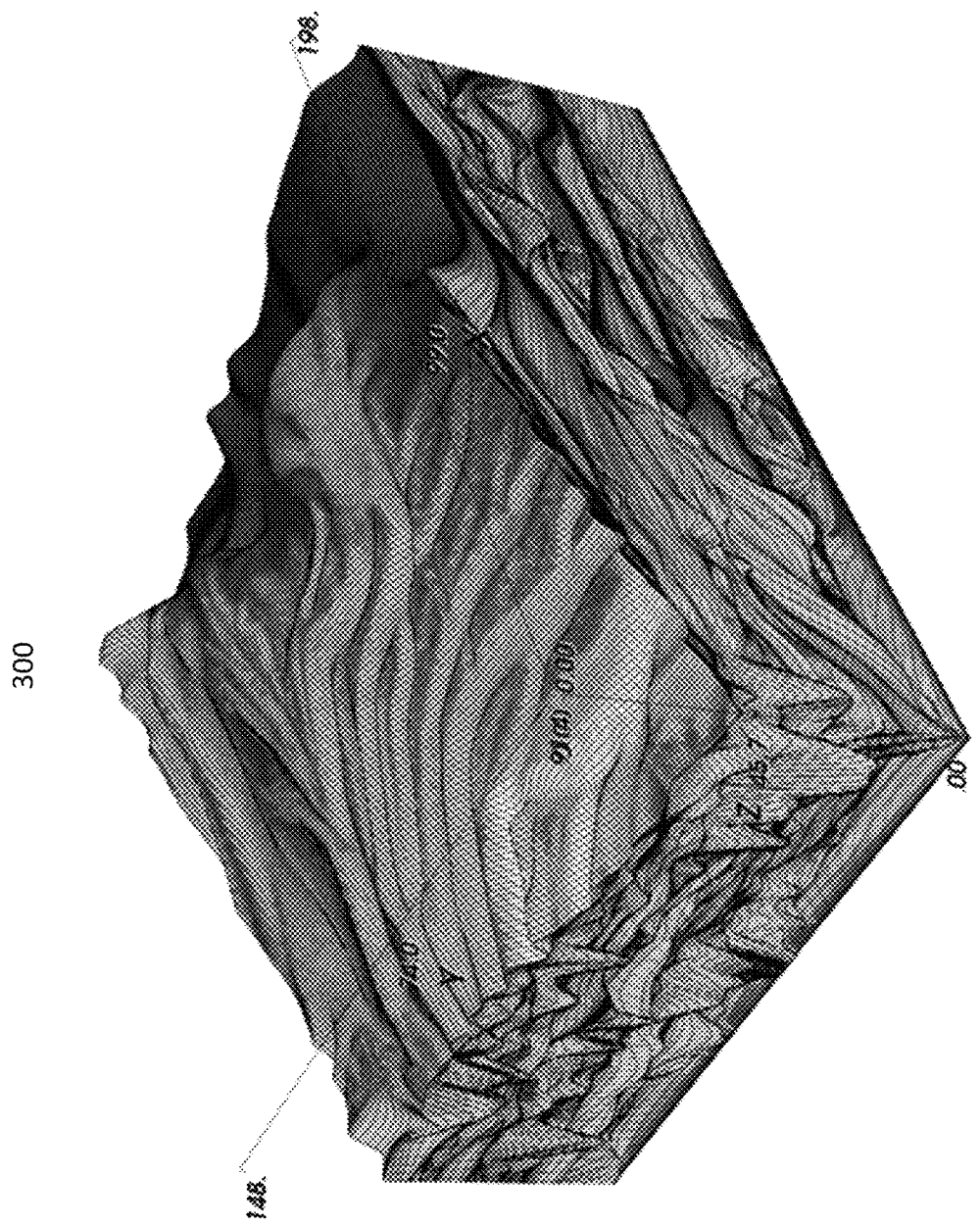
FIG. 3 illustrates an example subsurface representation.

FIG. 3 illustrates an example subsurface representation 300. The subsurface representation 300 may define simulated subsurface configuration of a simulated subsurface region. The simulated subsurface configuration may be defined within the subsurface representation 300 as a function of spatial location, such as a function of vertical spatial location (e.g., depth), lateral spatial location (e.g., x-y coordinate in map view), and/or other spatial location. The simulated subsurface configuration may be defined within the subsurface representation 300 as a function of temporal location (e.g., time of deposition). For example, the subsurface representation 300 may define different types, shapes, and/or properties of materials and/or layers as a function of depth into the ground and as a function of lateral spatial location. The subsurface representation 300 may define different types, shapes, and/or properties of materials and/or layers as a function of time at which the materials were deposited. The simulated subsurface configuration defined within the subsurface representation 300 may simulate the subsurface configuration that would be seen within a volume (e.g., well, reservoir) in the ground.

A simulated subsurface region of a subsurface representation may include simulated wells. A simulated well may refer to a well simulated within a subsurface representation. A simulated well may be referred to as a pseudo well. A simulated well may refer to a simulated volume, a simulated hole, and/or a simulated tunnel within the simulated subsurface region. A simulated well may refer to a portion of the subsurface representation/simulated subsurface region that includes, runs through, and/or exposes different simulated subsurface configuration. A simulated well may include, run through, and/or expose different types of simulated layers and/or simulated materials (e.g., sedimentary rocks) in the ground. A simulated well may be characterized by the simulated subsurface configuration that are included within and/or surround the simulated well. A simulated well may extend along one or more directions. For example, a simulated well may include a simulated vertical well, a simulated horizontal well, a simulated deviated well, and/or other type of simulated well. For instance, individual simulated wells may refer to and/or correspond to 1D series of data (e.g., vertical data, horizontal data, deviated data) within/extracted from the subsurface representation.

In some implementations, a simulated subsurface region may be a temporal zone and/or a spatial zone of a larger simulated subsurface region. The larger simulated subsurface region may be segmented into multiple zones, such as multiple temporal zones and/or multiple spatial zones. Temporal zones may include portions of the larger simulated subsurface region that are separated in time (e.g., time of deposition). Spatial zones may include portions of the larger simulated subsurface region that are separated in space (e.g., separate reservoirs). The larger simulated subsurface region may be segmented into multiple zones to enable separate analysis for individual zones. For example, the larger simulated subsurface region may have a depositional environment that has shifted, resulting in multiple sub-reservoirs that are disconnected. The larger simulated subsurface region may be segmented into multiple zones, with individual zones including individual sub-reservoirs. The analysis of the simulated subsurface region disclosed herein may be repeated for individual zones to select representative wells for individual zones.

The property component 104 may be configured to determine one or more properties of interest for the simulated subsurface region. The propert(ies) of interest for the simulated subsurface region may be determined based on the simulated subsurface configuration of the simulated subsurface region and/or other information. A property of interest may refer to a subsurface property that is of interest in the simulated subsurface region. A property of interest may refer to a subsurface property that is desired to be characterized by wells selected to represent the simulated subsurface region. Representative wells may be selected for the simulated subsurface region to provide representation of one or more properties of interest. In some implementations, one or more properties of interest for the simulated subsurface region may be manually selected. In some implementations, one or more properties of interest for the simulated subsurface region may be automatically selected.

Propert(ies) of interest for the simulated subsurface region may be determined for the entirety of the simulated subsurface region. Propert(ies) of interest for the simulated subsurface region may include one or more bulk properties of the simulated subsurface region. For example, properties of interest may include one or more of net-to-gross ratio, thickness (average model thickness), fraction of course grains, fraction of fine grains, coefficient of variation, Lorenz coefficient, total Kh (product of formation permeability and producing formation thickness), connected Kh, connected sand, porosity, permeability, acoustic properties, uniformity of subsurface properties, heterogeneity of subsurface properties, and/or other properties of interest.

Propert(ies) of interest for the simulated subsurface region may be determined as numerical values, categorial values (e.g., classes), and/or other values. For example, propert(ies) of interest may be determined as averages of subsurface properties within the simulated subsurface region. Propert (ies) of interest may be determined based on the simulated subsurface configuration of individual simulated wells within the simulated subsurface region. For instance, the propert(ies) of interest may be determined based on 1D series of data within/extracted from the subsurface representation. Propert(ies) of interest may be determined based on analysis of the simulated subsurface configuration of individual simulated wells and/or based on analysis of the simulated subsurface configuration of groupings of simulated wells. For instance, individual 1D series of data and/or groupings of 1D series of data may be reduced to a single numerical value for a particular property of interest, and the property of interest for the simulated subsurface region may be determined based on combination (e.g., average) of the single numerical values. The resolution (e.g., lateral resolution, vertical resolution, spatial resolution, temporal resolution) with which a property of interest is determined may depend on the property of interest, the subsurface representation, and/or other information.

In some implementations, the simulated subsurface region may be segmented into pieces (e.g., sub-sections, sub-volumes, sub-regions), and propert(ies) of interest may be determined for individual pieces. Propert(ies) of interest for the simulated subsurface region may be determined based on combination of (e.g., average, weighted combination) of the propert(ies) of interest determined for the individual pieces of the simulated subsurface region. Other determination of propert(ies) of interest for the simulated subsurface region is contemplated.

The similarity component 106 may be configured to determine extent of similarity between individual ones of the simulated wells and other ones of the simulated wells. Extent of similarity between two simulated wells may refer to a degree, an amount, and/or other extent to which the two simulated wells are similar. The extent of similarity between the simulated wells may be determined based on comparison of the simulated subsurface configuration of the simulated wells and/or other information. For example, the simulated subsurface configuration of a 1D series of data may be compared to the simulated subsurface configuration of other 1D series of data within/extracted from the subsurface representation to determine the extent of similarity between the two 1D series of data. Other determinations of the extent of similarity between simulated wells are contemplated.

In some implementations, the simulated subsurface configuration of a single simulated well may be compared with the simulated subsurface configuration of other simulated wells within the simulated subsurface region to determine how the subsurface configuration of the single simulated well relates to/correlates with other simulated wells within the simulated subsurface region. Determining the extent of similarity between a single simulated well and other simulated wells may provide information on how representative the single simulated well is of the simulated subsurface region. In some implementations, determining extent of similarity between simulated wells may include determining extent of dissimilarity between the simulated wells.

In some implementations, comparison of the simulated subsurface configuration of the simulated wells may include comparison of one or more subsurface properties of the simulated well. For example, one or more well logs (e.g., grain size logs) of simulated wells may be compared to determine the extent of similarity between the simulated wells. The subsurface propert(ies) of the simulated wells may be compared as a function of spatial and/or temporal position. For example, the subsurface propert(ies) of the simulated wells may be compared as a function of distance along the simulated wells. For instance, for vertical simulated wells, the subsurface propert(ies) may be compared as a function of depth. In some implementations, comparison of the simulated subsurface configuration of the simulated wells may be performed using one or more pattern recognition techniques, pattern matching techniques, lithostratigraphic analysis techniques, and/or other comparison techniques.

The extent of similarity between the simulated wells may be determined based on quantity and/or quality of match between the simulated subsurface configuration of the simulated wells. For example, the extent of similarity between the simulated wells may be determined based on similarity of the values of the subsurface properties and/or based on similarity of the changes in values of the subsurface properties. For instance, the extent of similarity between vertical simulated wells may be determined based on closeness of the values of subsurface properties at same depths. The extent of similarity between vertical simulated wells may be determined based on trends in changes in the values of the subsurface properties (e.g., increasing, decreasing) as a function of depth. The extent of similarity between the simulated wells may be determined for entire lengths of the simulated wells and/or for different segments of the simulated wells.

In some implementations, the extent of similarity between the individual ones of the simulated wells and the other ones of the simulated wells may be determined as values of similarity metric. Similarity metric may refer to one or more standards, systems, and/or factors for measuring similarity between different wells. Values of similarity metric may be determined based on assessment of the simulated subsurface configuration of the simulated well. For example, similarity metric may include one or more of mathematical correlation coefficient (e.g., Pearson correlation coefficient), dynamic time warp score, and/or other metrics for providing similarity between different wells.

Figure 4A:
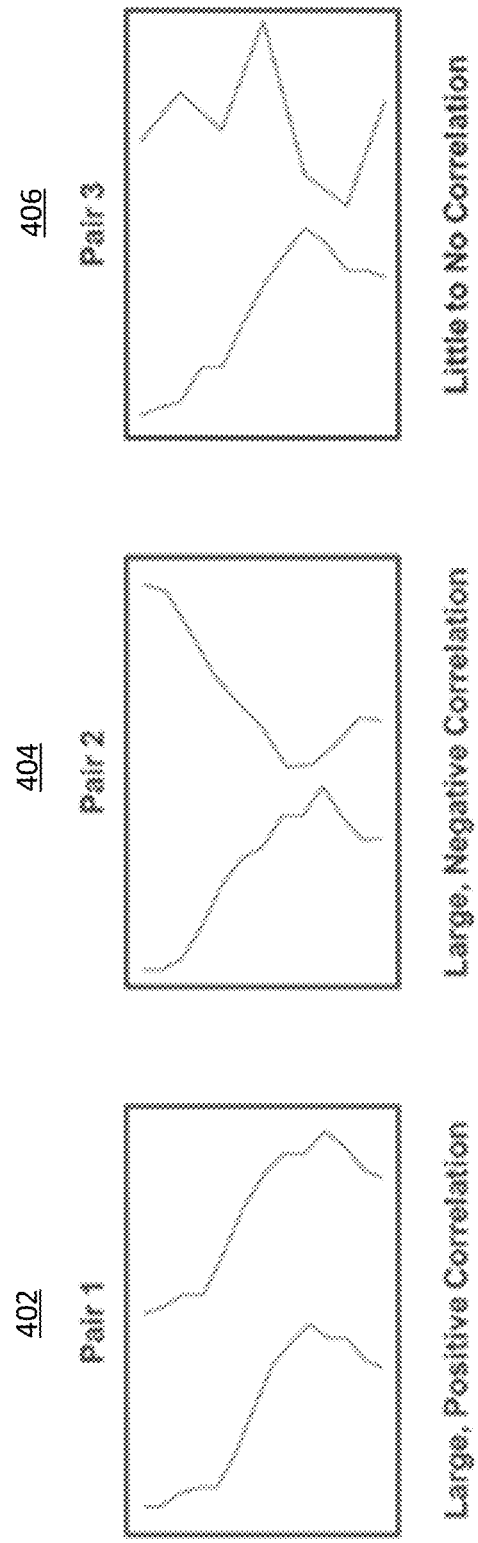
FIGS. 4A and 4B illustrate example comparisons of simulated subsurface configuration.
Figure 4B:
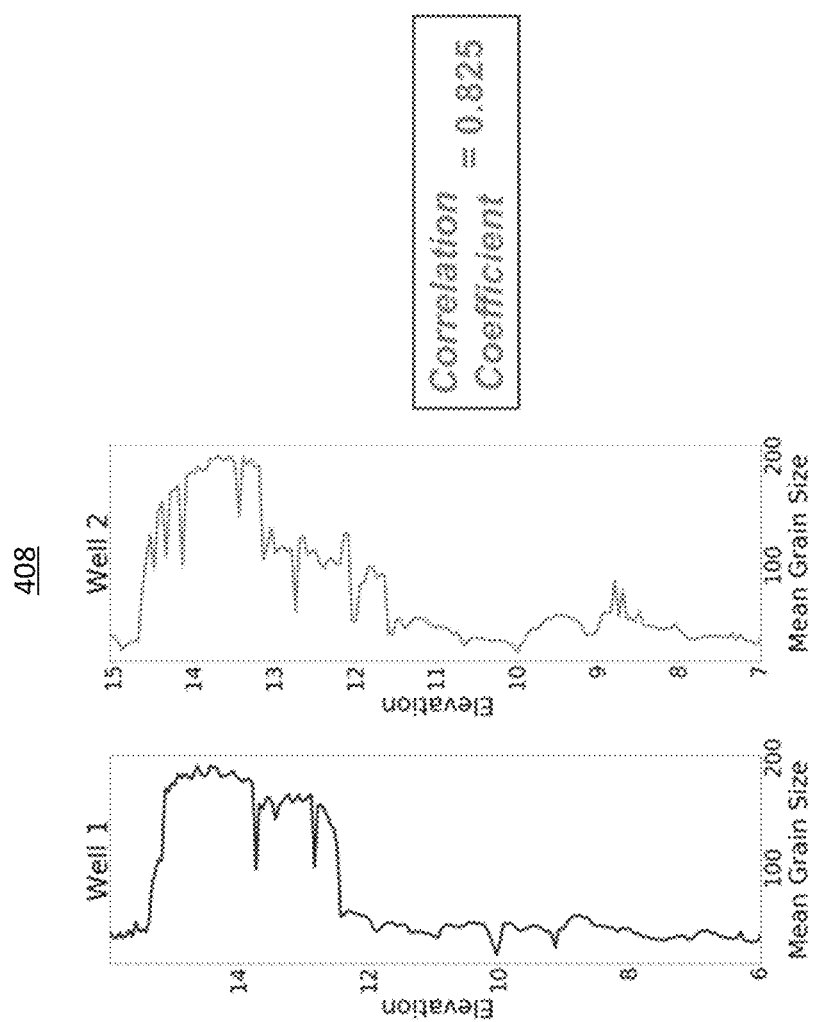

FIGS. 4A and 4B illustrate example comparisons of simulated subsurface configuration. In FIG. 4A, comparisons 402, 402, 406 may provide visualization of grain size logs for three pairs of simulated wells. In the comparison 402, the grain size of the simulated wells may follow a similar trend of increasing/decreasing grain size as a function of depth, resulting in large, positive correlation between the two simulated wells. In the comparison 404, the grain size of one simulated well may inversely mirror the grain size of the other simulated well (increase while the other is decreasing, and vice versa), resulting in large, negative correlation between the two simulated wells. In the comparison 406, there may be little to no relationship between the grain size of the two simulated wells, resulting in little to no correlation.

In FIG. 4B, comparison 408 may provide visualization of grain size logs for a pair of simulated wells. The mean grain size of the simulated wells may be compared at different depths/distances along the simulated well to determine the extent of similarity between the simulated wells. The extent of similarity between the simulated wells may be determined as a value of similarity metric, such as a value of correlation coefficient. For instance, the extent of the similarity of the mean grain size between the two simulated wells may be determined as 0.825. Values closer to 1 may indicate more similarity while values closer to 0 may indicate less similarity. Other values of similarity metric are contemplated. In some implementations, positive values of the similarity metric may indicate direct correlation between simulated wells, and negative values of the similarity metric may indicate inverse correlation between simulated wells.

While comparison of the simulated wells are performed using grain size in FIGS. 4A and 4B, the use of grain size is merely an example and is not meant to be limiting. Other subsurface configuration/subsurface properties may be used for the comparison. For example, multiple subsurface properties of the simulated wells may be compared to determine the extent of similarity between the simulated wells. Individual subsurface property comparisons may be used to determine separate values of similarity metric. Multiple subsurface property comparisons may be used to determine a single value of similarity metric. Different subsurface property comparisons may be weighed equally or differently when combining the comparisons for similarity metric value determination.

The extent of similarity between a single simulated well and other simulated wells may be used to determine spatial representative coverage of the single simulated well for the simulated subsurface region. Spatial representative coverage of a simulated well may refer to spatial amount of the simulated subsurface region that is represented by the simulated well. Spatial representative coverage of a simulated well may refer spatial amount of the simulated subsurface region that has the same or similar subsurface configuration as the simulated well. Spatial representative coverage of a simulated well may refer to spatial amount of the simulated subsurface region for which the simulated well is representative.

Spatial representative coverage of an individual simulated well for the simulated subsurface region may be determined based on thresholding the extent of similarity between the individual simulated well and other simulated wells. Thresholding the extent of the similarity between a simulated well and other simulated wells may include determining which of the other simulated wells are similar enough to the simulated well so that the simulated subsurface configuration of the simulated well is representative of the simulated subsurface configuration of the other simulated wells. Whether other simulated wells are similar enough to the simulated well may be determined based on a similarity metric threshold and/or other information. That is, thresholding the extent of similarity between a simulated well and other simulated wells may be performed based on a similarity metric threshold, and/or other information. The extent of similarity between the simulated wells may be compared to the similarity metric threshold, and comparisons that satisfy the similarity metric threshold (e.g., value of the similarity metric is greater than or equal to the value of the similarity metric threshold) may result in the corresponding simulated wells being determined to be similar enough.

The value of the similarity metric threshold may determine how closely the subsurface configuration of a simulated well must match the subsurface configuration of other simulated wells for the simulated well to be representative of the other simulated wells. The value of the similarity metric threshold may be selected based on the desired strength of statistical trend between a simulated well and other simulated wells.

In some implementations, different values of similarity metric threshold may be used for separate values of similarity metric. Values of similarity metric determined for different subsurface properties may be compared to separate similarity metric threshold values. For example, a value of similarity metric may be determined using comparison of grain size of simulated wells while another value of similarity metric may be determined using comparison of porosity of simulated wells. The similarity metric threshold value used for the grain size similarity metric value may be different from the similarity metric threshold value used for the porosity similarity metric value. Thus, the values of the similarity metric may be calibrated to the subsurface properties used to determine the extent of similarity between the simulated wells.

In some implementations, the similarity metric threshold may be static (e.g., hard-coded threshold). In some implementations, the similarity metric threshold may be dynamic (e.g., soft-coded threshold). For example, the value of the similarity metric threshold may change based on the values of the similarity metric. For instance, the value of the similarity metric threshold may change based on the distribution of the similarity metric values determined for the simulated wells so that a simulated well is determined to be representative of a certain percentage (e.g., upper x %) of other simulated wells. Other determination of similarity metric threshold is contemplated.

Figures 5A, 5B:
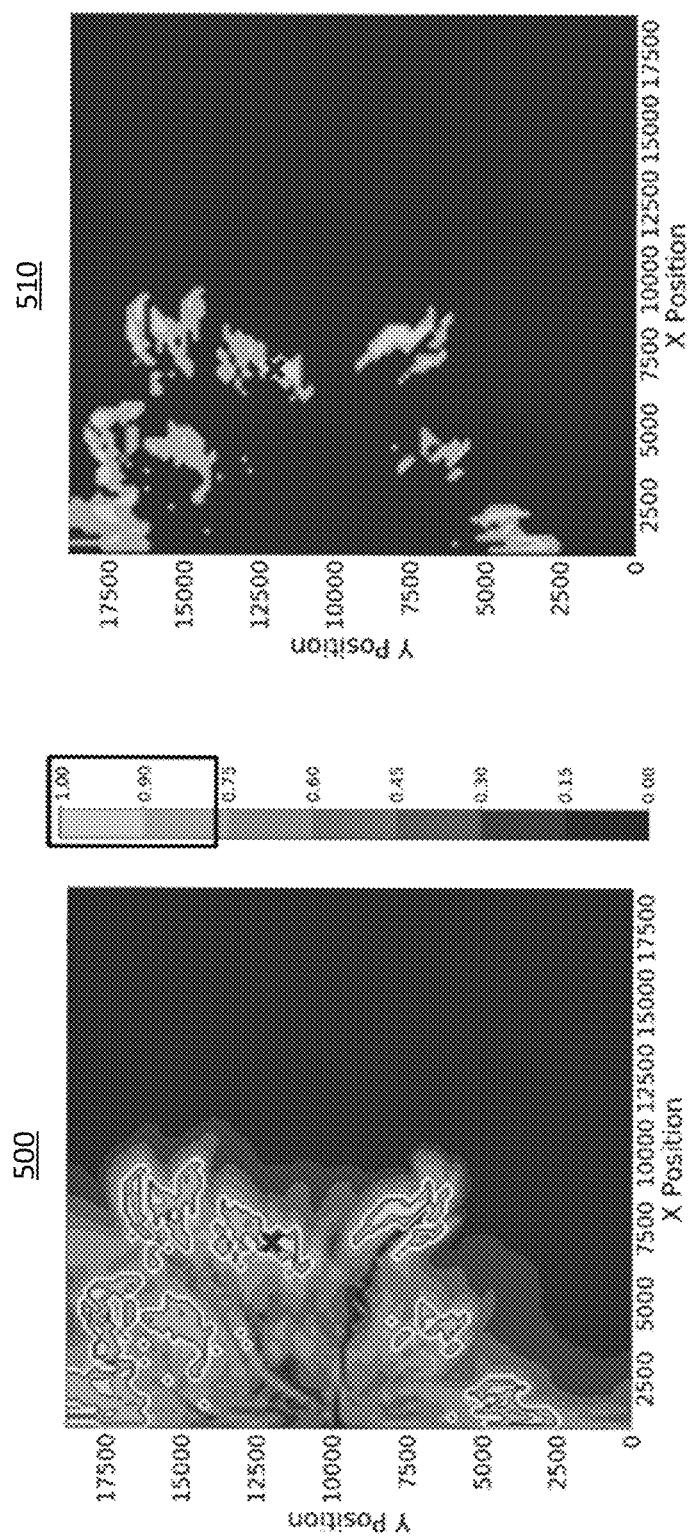
FIG. 5A illustrates an example map showing extent of similarity between simulated wells.
FIG. 5B illustrates an example map showing spatial representative coverage of a simulated well.

FIG. 5A illustrates an example map 500 showing extent of similarity between simulated wells. The map 500 may show the extent of similarity between the simulated well located at x-position 7400 and y-position 12000. Different shadings/colors of the map 500 may visually indicate the extent of similarity between the simulated well. For example, the lightest shading/coloring may indicate highest extent of similarity (e.g., similarity metric value of 1) and the darkest shading/coloring may indicate lowest extent of similarity (e.g., similarity metric value of 0). Portions of the map 500 corresponding to simulated wells that have similarity metric value greater than (or equal to) the similarity metric threshold may be surrounded by borders.

FIG. 5B illustrates an example map 510 showing spatial representative coverage of a simulated well. The map 510 may show spatial representative coverage of the simulated well located at x-position 7400 and y-position 12000. Portions of the map 510 corresponding to simulated wells that have similarity metric value greater than (or equal to) the similarity metric threshold may be shaded/colored as shown in FIG. 5A, while portions of the map 510 corresponding to simulated wells that have similarity metric value less than the similarity metric threshold may be shaded/colored using a single darker shading/color. In some implementations, the spatial representative coverage of the simulated well may be calculated as percentage/ratio of the simulated subsurface region represented by the simulated well. For example, the spatial representative coverage of a simulated well may be calculated as a ratio of the number of simulated wells that satisfy the similarity metric threshold over the total number of simulated wells.

The representative well component 108 may be configured to select representative wells from the simulated wells. A combination of simulated wells may be selected from the simulated wells of the simulated subsurface region to represent the simulated subsurface region/subsurface representation. The representative wells may be selected based on one or more properties of interest for the simulated subsurface region, the spatial representative coverage of the simulated wells, and/or other information. The representative wells may be selected based on the propert(ies) of interest so that the propert(ies) of interest for the simulated subsurface region are adequately represented by the representative wells. The representative wells may be selected based on the spatial representative coverage of the simulated wells so that the simulated subsurface configuration of the representative wells are adequately representative of the simulated subsurface configuration of the simulated subsurface region. That is, the representative wells may be selected to achieve desired spatial representative coverage for the simulated subsurface region and to achieve desired representation of the propert(ies) of interest for the simulated subsurface region. The desired spatial representative coverage for the simulated subsurface region may refer to the desired spatial amount of the simulated subsurface region to be represented by the representative wells. The desired representation of the propert(ies) of interest may refer to desired extent to which the representative wells are representative of the propert(ies) of interest (e.g., within a threshold value/percentage of the propert(ies) of interest).

In some implementations, selecting the representative wells from the simulated wells may include determining a number of the representative wells, determining spatial arrangement of the representative wells, and/or determining other characteristics of the representative wells. Number of the representative wells may refer to the number of simulated wells that are selected to be the representative wells for the simulated subsurface region. Selecting the representative wells from the simulated wells may include determining how many simulated wells from the simulated subsurface region/subsurface representation are used (e.g., needed) to adequately represent the simulated subsurface region/subsurface representation. Spatial arrangement of the representative wells may refer to physical arrangement of the representative wells within the subsurface region/subsurface representation and/or physical arrangement of the representative wells with respect to one another. Selecting the representative wells from the simulated wells may include determining placement of the representative wells within the subsurface region/subsurface representation.

In some implementation, the number and/or the spatial arrangement of the representative wells may be determined to most effectively represent the subsurface region/subsurface representation. That is, the number and/or the spatial arrangement of the representative wells may be optimized to achieve desired spatial representative coverage for the simulated subsurface region and to achieve desired representation of the propert(ies) of interest for the simulated subsurface region. The number and/or the spatial arrangement of the representative wells may be optimized to reduce/minimize the total number of wells needed to effectively characterize the subsurface region/subsurface representation. Identifying the minimum numbers of wells needed to effectively characterize the subsurface region/subsurface representation may include assessment of redundant information that would be provided by non-optimally placed wells. The optimal placement of wells in the subsurface region/subsurface representation may reduce amount of data that needs to be processed for the subsurface region/subsurface representation and provide cost savings (e.g., through easier data management, through use of less processing power). The optimal placement of wells in the subsurface region/subsurface representation may provide cost-savings in exploration of subsurface regions in the real world. For example, the optimal placement of wells determined through analysis of the subsurface region/subsurface representation may be used to reduce the number of real wells needed for effective appraisal of subsurface regions in the real world.

In some implementations, multiple properties of interest may be desired to be represented by the representative wells. The representative wells may be determined so that desired representation of all properties of interest of the simulated subsurface region are achieved. In some implementations, distribution of one or more properties may be desired to be represented by the representative wells. In such cases, the number and/or spatial arrangement of representative wells may be determined to recreate the distribution of the propert(ies).

In some implementations, the number of the representative wells may be fixed, and the spatial arrangement of the representative wells may be determined to maximize spatial representative coverage of the representative wells. That is, the number of simulated wells that may be selected as representative wells may be set. The spatial arrangement of the fixed number of representative wells may be determined so that the largest spatial representative coverage is achieved. The placement of the fixed number of representative wells may be determined to maximize the spatial representative coverage of the representative wells, while being representative of the propert(ies) of interest.

In some implementations, one or more locations of the representative wells may be fixed. That is, the location of the representative well(s) within the simulated subsurface region/subsurface representation may be set. The location of the representative well(s) may be set to correspond to location of real wells. For example, one or more appraisal/development wells may already have been drilled and/or the placement of appraisal/development well(s) may already be set. The locations of these wells may be used as locations of representative wells. Locations of other representative wells may be determined so that desired/largest spatial representative coverage and desired representation of the propert(ies) of interest is achieved.

In some implementations, determining the number of the representative wells may include determining a minimum number of wells needed to achieve the desired spatial representative coverage for the simulated subsurface region. The number of simulated wells that may be selected as representative wells may not be fixed, and the minimum number of representative wells that provides the desired spatial representative coverage and the desired representation of the propert(ies) of interest for the simulated subsurface region may be determined. Such representative wells may be used to explain (represent, characterize) the properties of interest (bulk properties) of the simulated subsurface region/subsurface representation with as little deviation from the properties of the full simulated subsurface region/subsurface representation and without redundant data points.

Figure 6A:
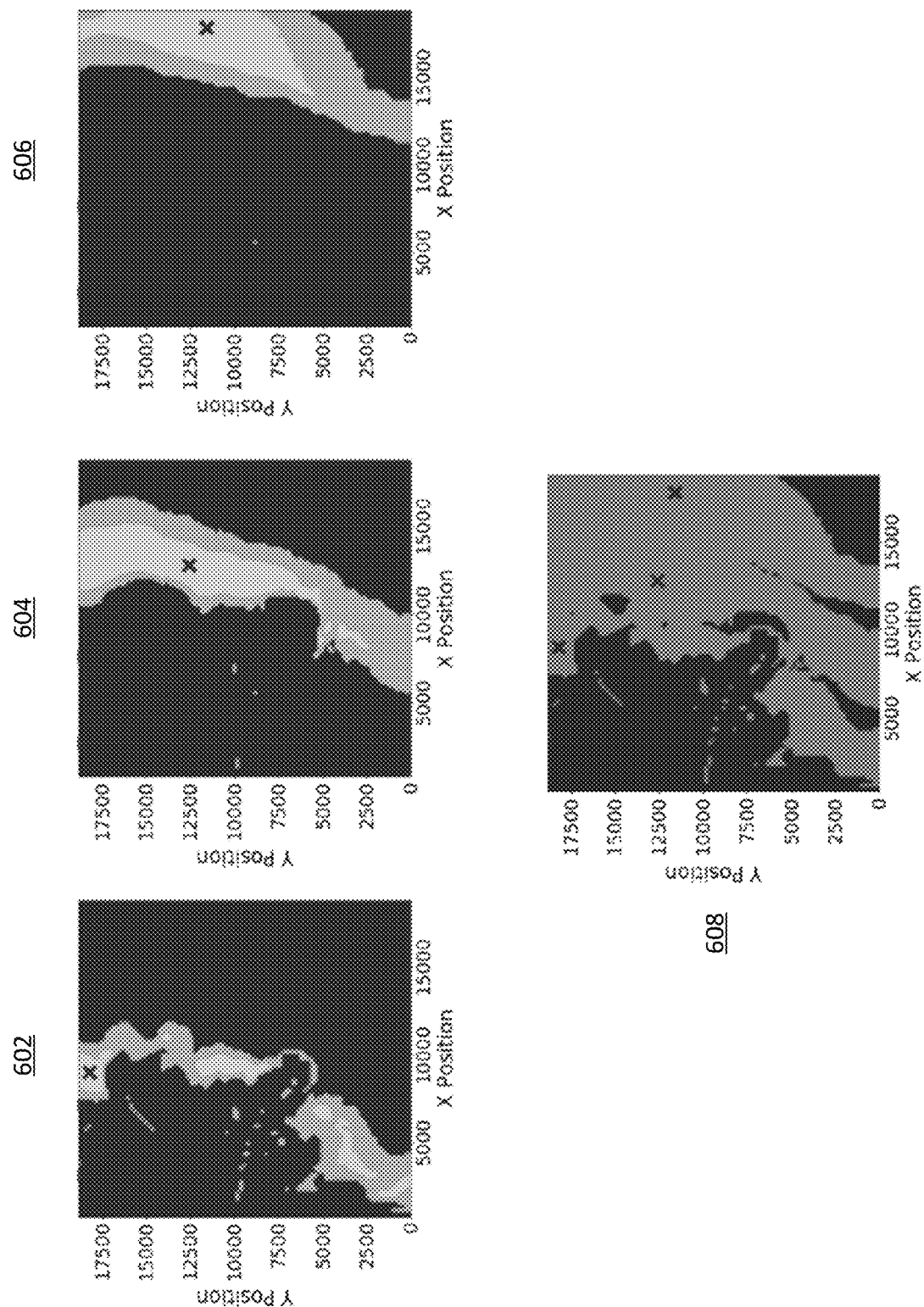
FIGS. 6A and 6B illustrate example maps showing spatial representative coverage of simulated wells.
Figure 6B:
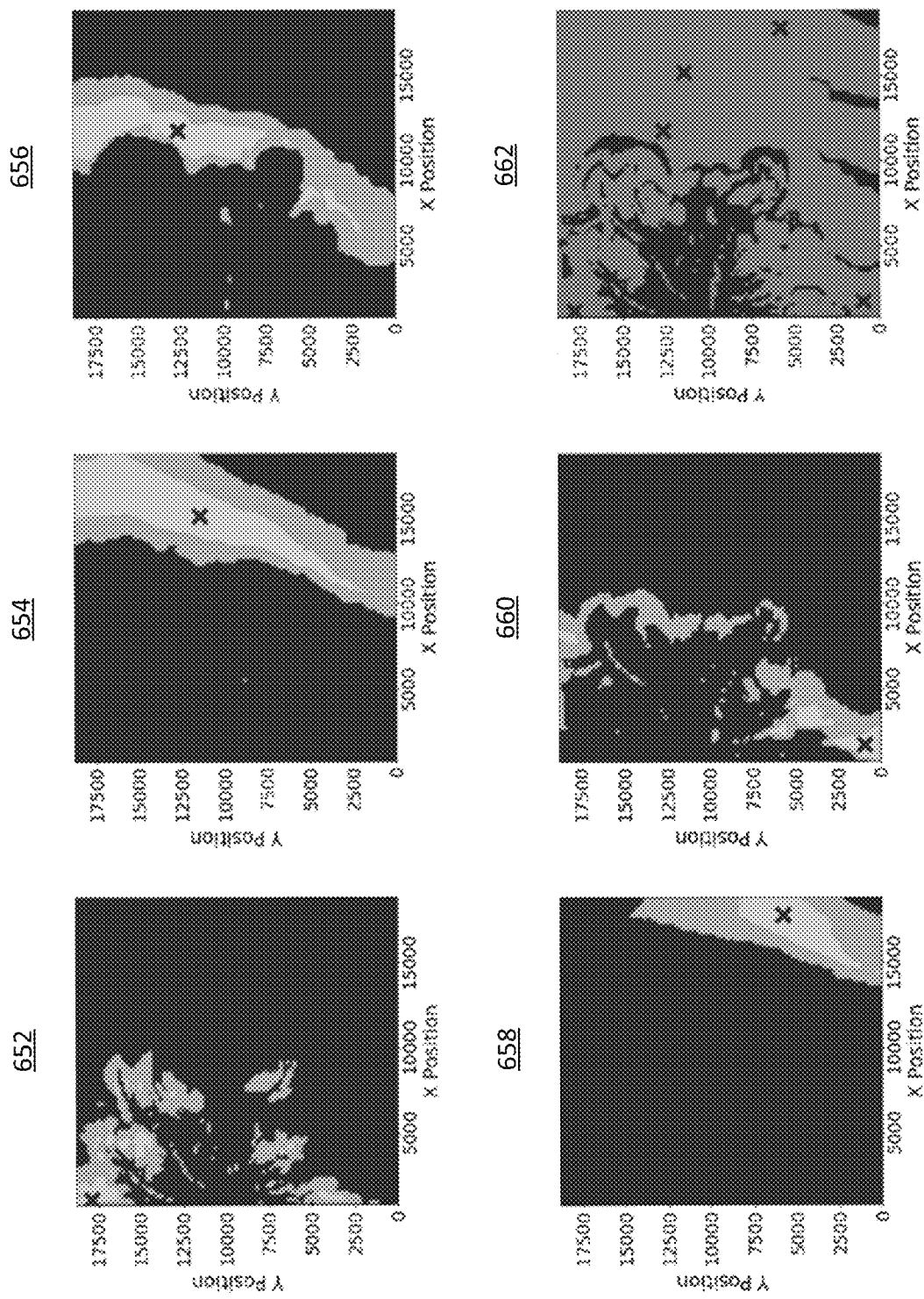

FIGS. 6A and 6B illustrate example maps showing spatial representative coverage of simulated wells. In FIG. 6A, maps 602, 604, 606 may show spatial representative coverage of three simulated wells. The map 602 may show spatial representative coverage of a simulated well located at x-position 9000 and y-position 18240. The map 604 may show representative coverage of a simulated well located at x-position 12800 and y-position 12620. The map 606 may show representative coverage of a simulated well located at x-position 17800 and y-position 11620. A map 608 may show combined spatial representative coverage of the three simulated wells. That is, the map 608 may show combination of the spatial representative coverage of the simulated wells located at x-position 9000 and y-position 18240, at x-position 12800 and y-position 12620, and at x-position 17800 and y-position 11620. The combined spatial representative coverage of the three simulated wells may cover more than 50% of the map 608. For example, the combined spatial representative coverage of the three simulated wells may cover 56.69% of the map 608. That is, the simulated subsurface configuration of these three simulated well may be representative of 56.69% of the simulated subsurface configuration of the whole simulated subsurface region/subsurface representation. The combined spatial representative coverage shown in the map 608 may be the largest spatial representative coverage possible from three simulated wells. That is, if only three simulated wells are to be selected as representative wells, then selection of the three simulated wells shown in the map 608 may result in the largest coverage of representation.

Increasing the number of representative wells may enable greater amounts of spatial representative coverage. For example, in FIG. 6B, maps 652, 654, 656, 658, 660 may show spatial representative coverage of five simulated wells. The map 652 may show spatial representative coverage of a simulated well located at x-position 1200 and y-position 17840. The map 654 may show representative coverage of a simulated well located at x-position 15200 and y-position 11420. The map 656 may show representative coverage of a simulated well located at x-position 11800 and y-position 12620. The map 658 may show representative coverage of a simulated well located at x-position 17800 and y-position 5800. The map 660 may show representative coverage of a simulated well located at x-position 1800 and y-position 1000. A map 662 may show combined spatial representative coverage of the five simulated wells. That is, the map 662 may show combination of the spatial representative coverage of the simulated wells located at x-position 1200 and y-position 17840, at x-position 15200 and y-position 11420, at x-position 11800 and y-position 12620, at x-position 17800 and y-position 5800, and at x-position 1800 and y-position 1000. The combined spatial representative coverage of the five simulated wells may cover 77.46% of the map 662. Thus, increasing the number of representative wells by two may enable the spatial representative coverage of the representative wells to be increased from 56.69% to 77.46%.

The representative wells may be selected to achieve the desired representation of multiple properties of interest for the simulated subsurface region. In some implementations, the representative wells may be selected simultaneously to achieve the desired representation of multiple properties of interest for the simulated subsurface region. For example, referring to FIG. 6A, the three simulated wells may be selected as representative wells based on the subsurface configuration of the three simulated wells matching the multiple properties of interest for the simulated subsurface region. For instance, the individual simulated subsurface configuration or the combined (e.g., averaged) simulated subsurface configuration of the three simulated wells may need to come within threshold value(s) of the multiple properties of interest, such as within minimal threshold of individual properties of interest. The placement of the representative wells may be optimized to minimize the difference between the properties of interest of representative wells and the properties of interest of the simulated subsurface region. For example, the placement of the representative wells may be optimized to minimize the difference between the average properties of interest (bulk properties) of the representative wells and the average properties of interest of the entire simulated subsurface region. The optimal placement of representative wells to minimize the difference between the average properties of the representative wells and the average properties of the simulated subsurface region may be used to optimize the number and location of expensive appraisal wells in the real world, such as appraisal wells used to assess the volume of hydrocarbons related to the average properties of the subsurface region in the real world.

Same or different threshold values may be used for different properties of interest (e.g., within 20% net-to-gross of the entire simulated subsurface region, within 10% thickness of the entire simulated subsurface region). Such selection of representative wells may include analysis of how the selected simulated wells compare to the entire simulated subsurface region/subsurface representation.

In some implementations, the representative wells may be selected sequentially to achieve the desired representation of multiple properties of interest for the simulated subsurface region. The sequential selection of the representative wells may be performed based on an ordering of the properties of interest for the simulated subsurface region and/or other information. The ordering of the properties of interest may refer to a sequence in which particular properties of interest are used to select the representative wells. For instance, the ordering of the properties of interest may refer to in which sequence the properties of interests are optimized. The ordering of the properties of interest may be determined automatically (e.g., using a default ordering, based on properties of interest) or manually (e.g., set by a user). Sequential selection of representative wells may include narrowing of representative wells by sequentially matching individual properties of interest for the simulated subsurface region. For instance, subsets of simulated wells may be sequentially selected as representative wells based on the simulated subsurface configuration of the simulated wells coming within minimal threshold of individual properties of interest.

For example, a set of simulated wells may be initially selected to achieve desired spatial representation of the simulated subsurface region. A subset of simulated wells may be selected from the set of simulated wells to achieve desired representation of the first property of interest within the ordering. A smaller subset of simulated wells may be selected from the subset of simulated wells to achieve desired representation of the second property of interest within the ordering, and so forth.

Figure 7:
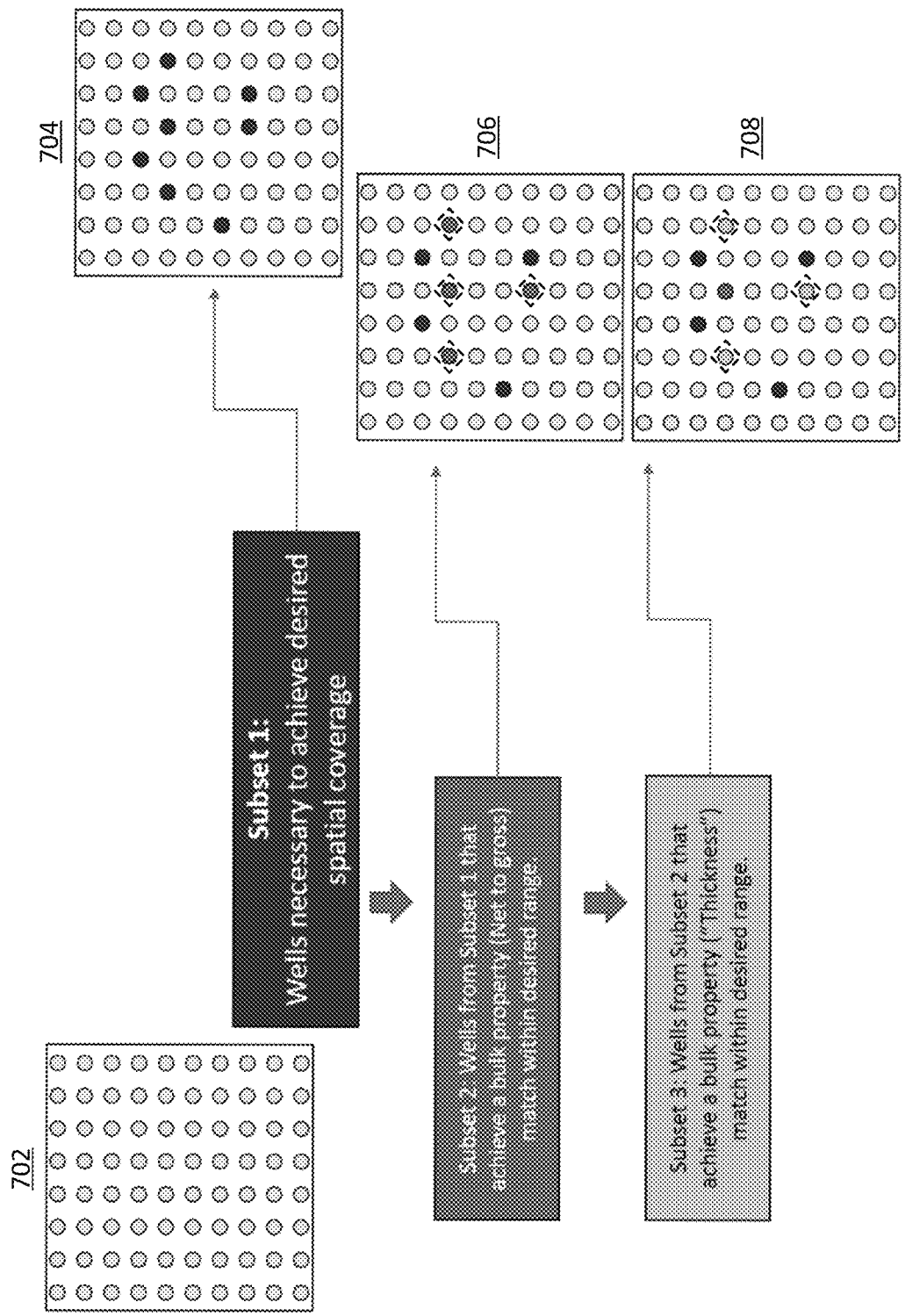
FIG. 7 illustrates example sequential selection of representative wells.

FIG. 7 illustrates example sequential selection of representative wells. In FIG. 7, the sequential selection of representative wells may be performed based on an ordering of properties of interest that starts with net-to-gross, followed by thickness. Other orderings of properties of interest are contemplated. In FIG. 7, the sequential selection of representative wells may start with finding simulated wells that provide desired spatial representative coverage of the simulated subsurface region. In some implementations, the desired spatial representative coverage of the simulated subsurface region may be used to find simulated wells at other stage in the sequence (e.g., in the middle, at the end).

A map 702 shows individual simulated wells (e.g., 1D series of data) in a simulated subsurface region. A map 704 shows a subset (subset 1) of the simulated wells. Subset 1 may include eight simulated wells. The eight simulated wells may be selected from among the simulated wells of the simulated subsurface region to achieve desired spatial representative coverage of the simulated subsurface region. A map 706 shows a smaller subset (subset 2) of the simulated wells. The subset 2 may include four simulated wells. The four simulated wells may be selected from within subset 1 to achieve desired representation of a property of interest (bulk property) for the simulated subsurface region. For instance, the four simulated wells may be selected from among the eight previously-selected simulated wells to achieve desired representation of net-to-gross for the simulated subsurface region. A map 708 shows even smaller subset (subset 3) of the simulated wells. The subset 3 may include 3 simulated wells. The three simulated wells may be selected from within subset 2 to achieve desired representation of another property of interest for the simulated subsurface region. For instance, the three simulated wells may be selected from among the four previously-selected simulated wells to achieve desired representation of thickness for the simulated subsurface region. Thickness may refer to thickness of the property of interest and/or thickness of the simulated well/subsurface representation.

Checks may be made in sequential selection of representative wells to make sure that desired spatial representative coverage and/or desired representation of the properties of interest is maintained during narrowing of the simulated wells. For example, referring to FIG. 7, checks may be made for the subset 3 to make sure that selection of fewer simulated wells as representative wells does not cause the spatial representative coverage to fall below the desired spatial representative coverage. Checks may be made for the subset 3 to make sure that the three simulated wells adequate represents all properties of interest for the simulated subsurface region.

In some implementations, multiple sets of representative wells may be selected. Individual sets of representative wells may include different combinations of simulated wells as representative wells for the simulated subsurface region/subsurface representation. Individual sets of representative wells may include combination of simulated wells that achieve desired spatial representative coverage for the simulated subsurface region/subsurface representation and desired representation of the properties of interest for the simulated subsurface region/subsurface representation. For instance, all possible 1D series of data within the simulated subsurface region/subsurface representation that achieve desired spatial representative coverage and desired representation of the properties of interest may be identified and stored as multiple realizations of representative wells. Different realizations may include same or different numbers of simulated wells. Different realizations may include different spatial arrangements of simulated wells.

In some implementations, multiple sets of representative wells may be selected from a single subsurface representation. That is, different combinations of wells may be selected as representative wells to represent the simulated subsurface configuration of a single subsurface representation. In some implementations, multiple sets of representative wells may be selected from multiple subsurface representations. That is, different combinations of wells may be selected as representative wells to represent the simulated subsurface configuration of different subsurface representations. For instance, multiple subsurface representations of a particular environment of deposition may be obtained and analyzed to select one or more sets of representative wells from individual subsurface representations.

A common pattern of spatial arrangement of representative wells within the multiple sets of representative wells may be identified. A common pattern of spatial arrangement of representative wells may refer to identical and/or similar pattern of spatial arrangement of representative wells. For example, spatial arrangements of representative wells with deviations that fall within a certain threshold may be treated as having a common pattern. A common pattern of the spatial arrangement of the representative wells may provide a pattern of wells for a subsurface region. The pattern of wells for the subsurface region may be used as a pattern of wells to be drilled in the subsurface region. For example, a common pattern of spatial arrangement of representative wells for one or more simulated subsurface regions may be identified. The simulated subsurface region may simulate subsurface configuration of a particular environment of deposition.

The common pattern of spatial arrangement of representative wells may be used as a pattern of wells for a subsurface region in the same environment of deposition. The pattern of wells for the subsurface region may be used as a pattern of exploration/development wells for the subsurface region. For instance, the selection representative wells disclosed herein may be performed on multiple subsurface representations of the same type, such as subsurface representations having the same type of environment of deposition, to detect a common pattern for the optimal spatial arrangement of most-representative wells. This common pattern may be used to drill the most optimal/representative wells in the real world with the same type of subsurface region (e.g., same environment of deposition). In some implementations, the pattern of wells may be catalogued and leveraged for appraisal strategies. For instance, different patterns of wells may be identified using subsurface representations of different environments of deposition. To develop appraisal strategies for a reservoir with a particular environment of deposition, the corresponding patterns of wells may be used to determine where to drill exploration/development wells.

Figure 8:
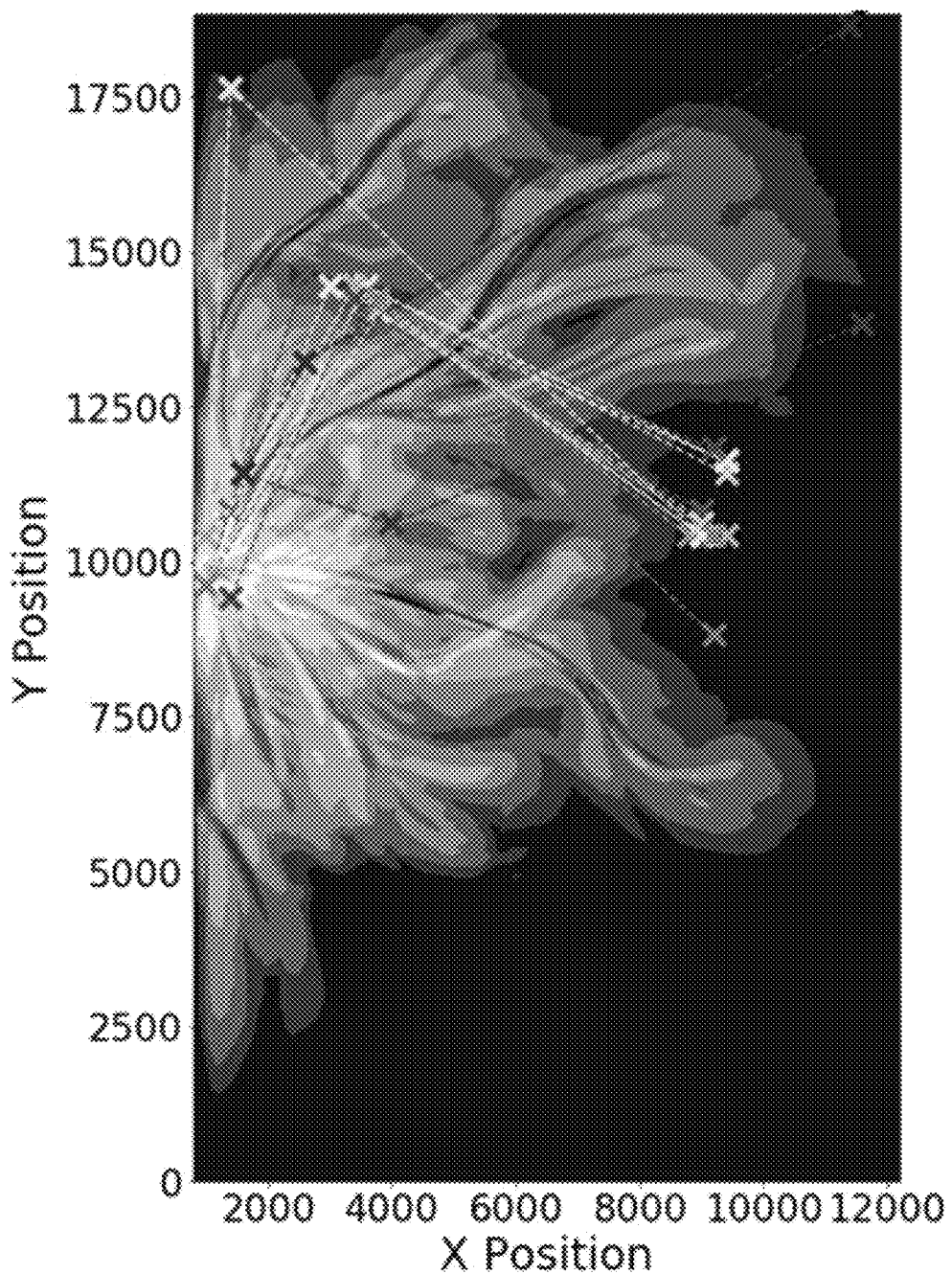
FIG. 8 illustrates example spatial arrangements of representative wells.

FIG. 8 illustrates example spatial arrangements of representative wells. FIG. 8 may show ten different three-well combinations of representative wells. The different combinations of representative wells may be identified using a subsurface representation for a simulated subsurface region. The simulated subsurface region may simulate the subsurface configuration of a subsurface region in the real world. Individual combinations of representative wells may include three simulated wells that achieve desired spatial representative coverage and desired representation of properties of interest for the simulated subsurface region. As shown in FIG. 8, seven of ten different spatial arrangements may be similar to each other. These seven spatial arrangement of representative wells may be identified as a common pattern, and may be used as a pattern of exploration/development wells for the subsurface region in the real world. For instance, the common pattern identified using the subsurface representation/simulated subsurface region may be used to develop strategy for drilling wells in a reservoir to obtain optimal sampling of the reservoir. Thus, multiple realizations of representative wells identified for same environment of deposition may be used to develop understanding of optimal number and locations of wells to be used for reservoir appraisal. Such understanding may enable incorporation of risks in drilling decisions. For example, if one or more wells cannot be drilled in optimal location(s), then analysis of the wells drilled in non-optimal locations may be weighed and/or skewed to account for non-optimal placement of the well(s) and with understanding that the subsurface configuration of such well(s) may not be representative of the entire subsurface region.

In some implementations, subsurface representations may be associated with different environments of deposition, and subsurface representations associated with particular environment(s) of deposition may be obtained for analysis. For example, the environment of deposition for a subsurface region to be explored may be known, and the subsurface representations associated with the particular environment of deposition may be obtained to identify number and/or spatial arrangement of representative well(s). As another example, one or more wells may have been drilled in a subsurface region. The well(s) may provide hard data points for subsurface representation(s) to be used in selecting representative wells. For example, the subsurface configuration and spatial arrangements of wells in the real world may be used as fixed data points that should be simulated by the subsurface representation(s). The subsurface representation(s) that simulated these fixed data points may be used to determine number and/or spatial arrangement of representative wells to be used in the real world. Thus, the amount of data available in the real world may be used to focus on subsurface representations for matching simulated subsurface region.

For example, to determine number and placement of exploration/development wells for a subsurface region in the real world, one or more subsurface representation(s) may be selected to perform the analysis disclosed herein. The subsurface representation(s) may be selected based on the information known about the subsurface region in the real world. If no information is known about the subsurface region in the real world, the subsurface representation(s) to be used may be selected from a suite of subsurface representations without restrictions on the subsurface representation(s) that may be selected (e.g., selected randomly). If general information (e.g., seismic information, regional information) is known about the subsurface region in the real world, such as information about the reservoir type (e.g., known depositional environments in the area from other fields or wells, seismic data that may hint at the type of environment), the general information may be used to select subsurface representation(s) that matches the general information (e.g., subsurface representation(s) for the same reservoir-type). If specific information is known about the subsurface region in the real world, such as based on analysis of well logs and/or well core(s) from well(s) drilled in the subsurface region that reveal subsurface configuration in the drilled well(s), the specific information may be used to select subsurface representation(s) that include simulated subsurface configuration that matches the subsurface configuration of the drilled well(s). For instance, three wells may have been drilled in the subsurface region to reveal the subsurface configuration in three different locations within the subsurface region.

A suite of subsurface representations may be searched to identify subsurface representation that includes simulated subsurface configuration at three locations that matches (is identical to, is similar to) the subsurface configuration of the three wells. The spatial arrangement of these three locations in the subsurface representation may need to match (is identical to, is similar to) the spatial arrangement of three wells in the real world. For example, the orientation, distance, and/or direction between the three locations in the subsurface representation may need to match the orientation, distance, and/or direction of the three wells in the real world. Thus, subsurface representation(s) that more closely match the subsurface region in the real world may be used to determine number and/or locations of the representative wells.

Implementations of the disclosure may be made in hardware, firmware, software, or any suitable combination thereof. Aspects of the disclosure may be implemented as instructions stored on a machine-readable medium, which may be read and executed by one or more processors. A machine-readable medium may include any mechanism for storing or transmitting information in a form readable by a machine (e.g., a computing device). For example, a tangible computer-readable storage medium may include read-only memory, random access memory, magnetic disk storage media, optical storage media, flash memory devices, and others, and a machine-readable transmission media may include forms of propagated signals, such as carrier waves, infrared signals, digital signals, and others. Firmware, software, routines, or instructions may be described herein in terms of specific exemplary aspects and implementations of the disclosure, and performing certain actions.

In some implementations, some or all of the functionalities attributed herein to the system 10 may be provided by external resources not included in the system 10. External resources may include hosts/sources of information, computing, and/or processing and/or other providers of information, computing, and/or processing outside of the system 10.

Although the processor 11 and the electronic storage 13 are shown to be connected to the interface 12 in FIG. 1, any communication medium may be used to facilitate interaction between any components of the system 10. One or more components of the system 10 may communicate with each other through hard-wired communication, wireless communication, or both. For example, one or more components of the system 10 may communicate with each other through a network. For example, the processor 11 may wirelessly communicate with the electronic storage 13. By way of non-limiting example, wireless communication may include one or more of radio communication, Bluetooth communication, Wi-Fi communication, cellular communication, infrared communication, or other wireless communication. Other types of communications are contemplated by the present disclosure.

Although the processor 11 is shown in FIG. 1 as a single entity, this is for illustrative purposes only. In some implementations, the processor 11 may comprise a plurality of processing units. These processing units may be physically located within the same device, or the processor 11 may represent processing functionality of a plurality of devices operating in coordination. The processor 11 may be separate from and/or be part of one or more components of the system 10. The processor 11 may be configured to execute one or more components by software; hardware; firmware; some combination of software, hardware, and/or firmware; and/or other mechanisms for configuring processing capabilities on the processor 11.

It should be appreciated that although computer program components are illustrated in FIG. 1 as being co-located within a single processing unit, one or more of computer program components may be located remotely from the other computer program components. While computer program components are described as performing or being configured to perform operations, computer program components may comprise instructions which may program processor 11 and/or system 10 to perform the operation.

While computer program components are described herein as being implemented via processor 11 through machine-readable instructions 100, this is merely for ease of reference and is not meant to be limiting. In some implementations, one or more functions of computer program components described herein may be implemented via hardware (e.g., dedicated chip, field-programmable gate array) rather than software. One or more functions of computer program components described herein may be software-implemented, hardware-implemented, or software and hardware-implemented.

The description of the functionality provided by the different computer program components described herein is for illustrative purposes, and is not intended to be limiting, as any of computer program components may provide more or less functionality than is described. For example, one or more of computer program components may be eliminated, and some or all of its functionality may be provided by other computer program components. As another example, processor 11 may be configured to execute one or more additional computer program components that may perform some or all of the functionality attributed to one or more of computer program components described herein.

The electronic storage media of the electronic storage 13 may be provided integrally (i.e., substantially non-removable) with one or more components of the system 10 and/or as removable storage that is connectable to one or more components of the system 10 via, for example, a port (e.g., a USB port, a Firewire port, etc.) or a drive (e.g., a disk drive, etc.). The electronic storage 13 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. The electronic storage 13 may be a separate component within the system 10, or the electronic storage 13 may be provided integrally with one or more other components of the system 10 (e.g., the processor 11). Although the electronic storage 13 is shown in FIG. 1 as a single entity, this is for illustrative purposes only. In some implementations, the electronic storage 13 may comprise a plurality of storage units. These storage units may be physically located within the same device, or the electronic storage 13 may represent storage functionality of a plurality of devices operating in coordination.

Figure 2:
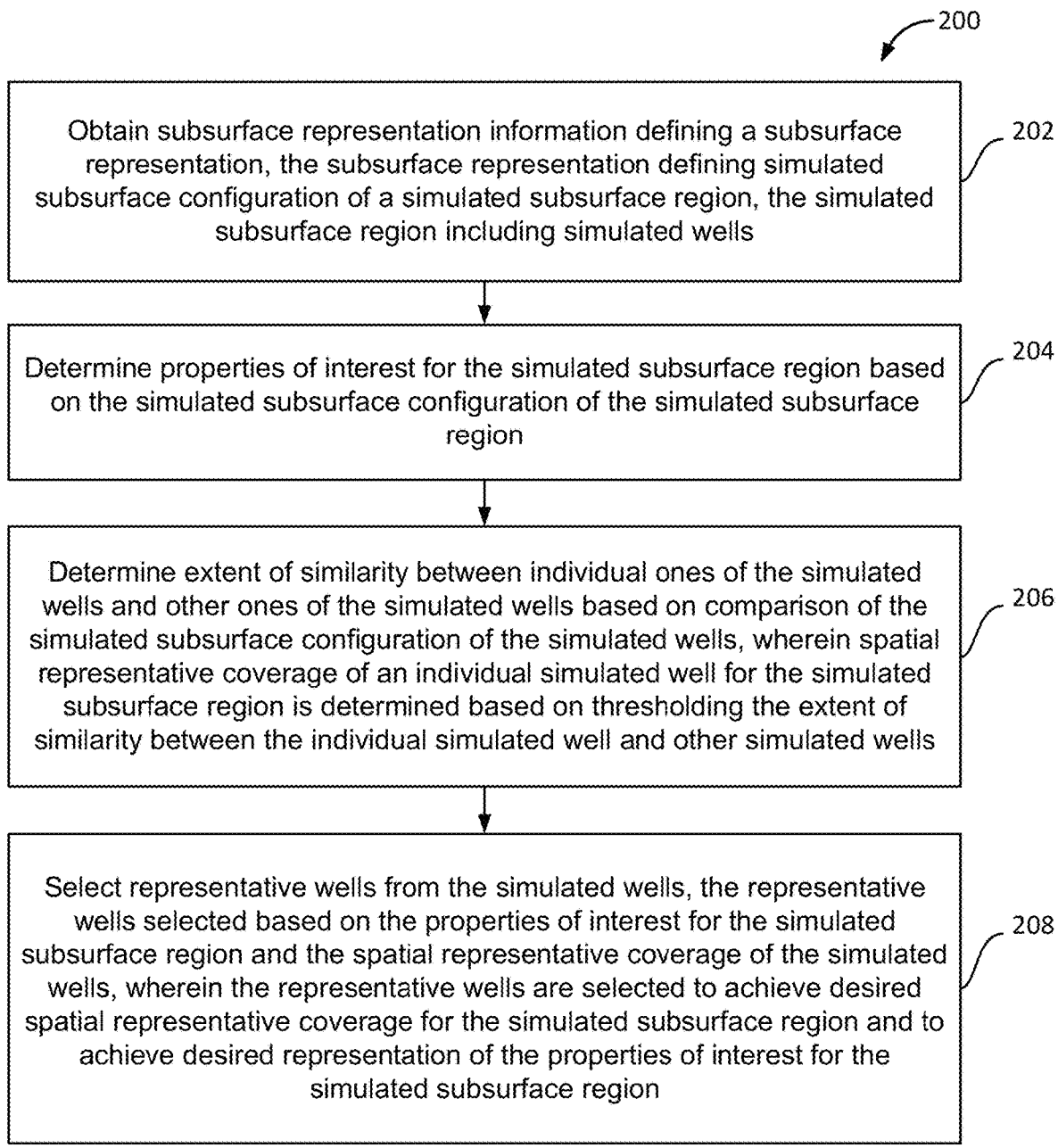
FIG. 2 illustrates an example method for determining wells to represent a subsurface region.

FIG. 2 illustrates method 200 for determining wells to represent a subsurface region. The operations of method 200 presented below are intended to be illustrative. In some implementations, method 200 may be accomplished with one or more additional operations not described, and/or without one or more of the operations discussed. In some implementations, two or more of the operations may occur substantially simultaneously.

In some implementations, method 200 may be implemented in one or more processing devices (e.g., a digital processor, an analog processor, a digital circuit designed to process information, a central processing unit, a graphics processing unit, a microcontroller, an analog circuit designed to process information, a state machine, and/or other mechanisms for electronically processing information). The one or more processing devices may include one or more devices executing some or all of the operations of method 200 in response to instructions stored electronically on one or more electronic storage media. The one or more processing devices may include one or more devices configured through hardware, firmware, and/or software to be specifically designed for execution of one or more of the operations of method 200.

Referring to FIG. 2 and method 200, at operation 202, subsurface representation information and/or other information may be obtained. The subsurface representation information may define a subsurface representation. The subsurface representation may define simulated subsurface configuration of a simulated subsurface region. The simulated subsurface region may include simulated wells. In some implementation, operation 202 may be performed by a processor component the same as or similar to the subsurface representation component 102 (Shown in FIG. 1 and described herein).

At operation 204, properties of interest for the simulated subsurface region may be determined based on the simulated subsurface configuration of the simulated subsurface region and/or other information. In some implementation, operation 204 may be performed by a processor component the same as or similar to the property component 104 (Shown in FIG. 1 and described herein).

At operation 206, extent of similarity between individual ones of the simulated wells and other ones of the simulated wells may be determined based on comparison of the simulated subsurface configuration of the simulated wells and/or other information. Spatial representative coverage of an individual simulated well for the simulated subsurface region may be determined based on thresholding the extent of similarity between the individual simulated well and other simulated wells and/or other information. In some implementation, operation 206 may be performed by a processor component the same as or similar to the similarity component 106 (Shown in FIG. 1 and described herein).

At operation 208, representative wells may be selected from the simulated wells. The representative wells may be selected based on the properties of interest for the simulated subsurface region, the spatial representative coverage of the simulated wells, and/or other information. The representative wells may be selected to achieve desired spatial representative coverage for the simulated subsurface region and to achieve desired representation of the properties of interest for the simulated subsurface region. In some implementation, operation 208 may be performed by a processor component the same as or similar to the representative well component 108 (Shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system for determining wells to represent a subsurface region, the system comprising:
one or more physical processors configured by machine-readable instructions to:
obtain subsurface representation information defining multiple subsurface representations, the multiple subsurface representations defining different simulated subsurface configurations of simulated subsurface regions corresponding to the subsurface region in the real world, individual simulated subsurface region including simulated wells, wherein the multiple subsurface representations are representative of an environment of deposition for the subsurface region in the real world;
for the individual subsurface representations:
determine properties of interest for a given simulated subsurface region based on the simulated subsurface configuration of the given simulated subsurface region;
determine extent of similarity between individual ones of the simulated wells and other ones of the simulated wells in the given simulated subsurface region based on comparison of the simulated subsurface configuration of the simulated wells in the given simulated subsurface region, wherein spatial representative coverage of an individual simulated well for the given simulated subsurface region is determined based on thresholding the extent of similarity between the individual simulated well and other simulated wells in the given simulated subsurface region; and
select a subset of the simulated wells as representative wells for the given simulated subsurface region, the representative wells for the given simulated subsurface region selected based on the properties of interest for the given simulated subsurface region and the spatial representative coverage of the simulated wells, wherein the representative wells are selected to achieve spatial representative coverage for the given simulated subsurface region and to achieve representation of the properties of interest for the given simulated subsurface region;
wherein multiple sets of representative wells are selected from the multiple subsurface representations, individual sets of representative wells providing spatial representative coverage for individual simulated subsurface regions and providing representation of the properties of interest for the individual simulated subsurface regions, the individual sets of representative wells including multiple simulated wells spatially arranged within the individual simulated subsurface regions; and
identify a common pattern of spatial arrangements of the multiple sets of the representative wells within the multiple subsurface representations to be used as a pattern of wells for the subsurface region in the real world, wherein the common pattern of the spatial arrangements of the multiple sets of the representative wells provides number and locations of wells in the subsurface region in the real world for exploration or development of the subsurface region in the real world.

2. The system of claim 1, wherein the extent of similarity between the individual ones of the simulated wells and the other ones of the simulated wells are determined as values of similarity metric, and thresholding the extent of similarity between the individual simulated well and the other simulated wells is performed based on a similarity metric threshold.

3. The system of claim 1, wherein selecting the representative wells includes determining a number of the representative wells and spatial arrangement of the representative wells.

4. The system of claim 3, wherein the number of the representative wells is fixed, and the spatial arrangement of the representative wells is determined to maximize spatial representative coverage of the representative wells.

5. The system of claim 3, wherein determining the number of the representative wells includes determining a minimum number of wells needed to achieve the spatial representative coverage for the given simulated subsurface region.

6. The system of claim 1, wherein the properties of interest for the given simulated subsurface region include net-to-gross ratio and thickness.

7. The system of claim 1, wherein the representative wells are selected simultaneously to achieve the representation of the properties of interest for the given simulated subsurface region.

8. The system of claim 1, wherein the representative wells are selected sequentially to achieve the representation of the properties of interest for the given simulated subsurface region, the sequential selection of the representative wells performed based on an ordering of the properties of interest for the given simulated subsurface region.

9. The system of claim 1, wherein:
the subsurface region in the real world include one or more wells; and
subsurface configuration and spatial arrangements of the one or more wells in the real world are used as fixed data points that are simulated by the multiple subsurface representations.

10. The system of claim 1, wherein the common pattern of the spatial arrangements of the multiple sets of the representative wells are identified to include the spatial arrangements of the multiple sets of the representative wells with deviations that fall within a threshold.

11. A method for determining wells to represent a subsurface region, the method comprising:
obtaining subsurface representation information defining multiple subsurface representations, the multiple subsurface representations defining different simulated subsurface configurations of simulated subsurface regions corresponding to the subsurface region in the real world, individual simulated subsurface region including simulated wells, wherein the multiple subsurface representations are representative of an environment of deposition for the subsurface region in the real world;
for the individual subsurface representations:
determining properties of interest for a given simulated subsurface region based on the simulated subsurface configuration of the given simulated subsurface region;
determining extent of similarity between individual ones of the simulated wells and other ones of the simulated wells in the given simulated subsurface region based on comparison of the simulated subsurface configuration of the simulated wells in the given simulated subsurface region, wherein spatial representative coverage of an individual simulated well for the given simulated subsurface region is determined based on thresholding the extent of similarity between the individual simulated well and other simulated wells in the given simulated subsurface region; and
selecting a subset of the simulated wells as representative wells for the given simulated subsurface region, the representative wells for the given simulated subsurface region selected based on the properties of interest for the given simulated subsurface region and the spatial representative coverage of the simulated wells, wherein the representative wells are selected to achieve spatial representative coverage for the given simulated subsurface region and to achieve representation of the properties of interest for the given simulated subsurface region;
wherein multiple sets of representative wells are selected from the multiple subsurface representations, individual sets of representative wells providing spatial representative coverage for individual simulated subsurface regions and providing representation of the properties of interest for the individual simulated subsurface regions, the individual sets of representative wells including multiple simulated wells spatially arranged within the individual simulated subsurface regions; and
identifying a common pattern of spatial arrangements of the multiple sets of the representative wells within the multiple subsurface representations to be used as a pattern of wells for the subsurface region in the real world, wherein the common pattern of the spatial arrangements of the multiple sets of the representative wells provides number and locations of wells in the subsurface region in the real world for exploration or development of the subsurface region in the real world.

12. The method of claim 11, wherein the extent of similarity between the individual ones of the simulated wells and the other ones of the simulated wells are determined as values of similarity metric, and thresholding the extent of similarity between the individual simulated well and the other simulated wells is performed based on a similarity metric threshold.

13. The method of claim 11, wherein selecting the representative wells includes determining a number of the representative wells and spatial arrangement of the representative wells.

14. The method of claim 13, wherein the number of the representative wells is fixed, and the spatial arrangement of the representative wells is determined to maximize spatial representative coverage of the representative wells.

15. The method of claim 13, wherein determining the number of the representative wells includes determining a minimum number of wells needed to achieve the spatial representative coverage for the given simulated subsurface region.

16. The method of claim 11, wherein the properties of interest for the given simulated subsurface region include net-to-gross ratio and thickness.

17. The method of claim 11, wherein the representative wells are selected simultaneously to achieve the representation of the properties of interest for the given simulated subsurface region.

18. The method of claim 11, wherein the representative wells are selected sequentially to achieve the representation of the properties of interest for the given simulated subsurface region, the sequential selection of the representative wells performed based on an ordering of the properties of interest for the given simulated subsurface region.

19. The method of claim 11, wherein:
the subsurface region in the real world include one or more wells; and
subsurface configuration and spatial arrangements of the one or more wells in the real world are used as fixed data points that are simulated by the multiple subsurface representations.

20. The method of claim 11, wherein the common pattern of the spatial arrangements of the multiple sets of the representative wells are identified to include the spatial arrangements of the multiple sets of the representative wells with deviations that fall within a threshold.

* * * * *